United States Patent [19]
Matsunaga et al.

[11] Patent Number: 6,045,981
[45] Date of Patent: Apr. 4, 2000

[54] METHOD OF MANUFACTURING SEMICONDUCTOR DEVICE

[75] Inventors: Kentaro Matsunaga; Akiko Mimotogi; Shoji Mimotogi; Soichi Inoue, all of Yokohama, Japan

[73] Assignee: Kabushiki Kaisha Toshiba, Tokyo, Japan

[21] Appl. No.: 09/019,925

[22] Filed: Feb. 6, 1998

[30] Foreign Application Priority Data

Feb. 7, 1997 [JP] Japan ................................. 9-025198

[51] Int. Cl.⁷ .................................................. G03F 7/00
[52] U.S. Cl. .......................... 430/330; 430/313; 430/315; 430/323; 430/324
[58] Field of Search ................................ 430/324, 315, 430/330, 313, 323

[56] References Cited

U.S. PATENT DOCUMENTS

| | | | |
|---|---|---|---|
| 4,665,007 | 5/1987 | Cservak | 430/311 |
| 4,968,757 | 11/1990 | Lee | 525/426 |
| 5,364,732 | 11/1994 | Mouri | 430/201 |

FOREIGN PATENT DOCUMENTS

| | | |
|---|---|---|
| 5-204131 | 8/1993 | Japan . |
| 6-242594 | 9/1994 | Japan . |
| 6-337514 | 12/1994 | Japan . |

*Primary Examiner*—Kathleen Duda
*Assistant Examiner*—Nicole Barreca
*Attorney, Agent, or Firm*—Finnegan, Henderson, Farabow, Garrett & Dunner, L.L.P.

[57] ABSTRACT

A method of manufacturing a semiconductor device, which comprises the steps of, selectively silylating a photosensitive resin film by exposing the photosensitive resin film according to an exposure pattern thereby to form a silylated portion having a glass transition temperature which is lower than that of the photosensitive resin film and at the same time exposing the photosensitive resin film to an intermediate temperature between the glass transition temperature of the silylated portion and the glass transition temperature of the photosensitive resin film thereby fluidizing the silylated portion so as to cover a portion of the photosensitive resin film neighboring the silylated portion with the fluidized silylated portion, and developing the photosensitive resin film by making use of the silylated portion and the portion of photosensitive resin film covered by the fluidized silylated portion as a mask.

16 Claims, 7 Drawing Sheets

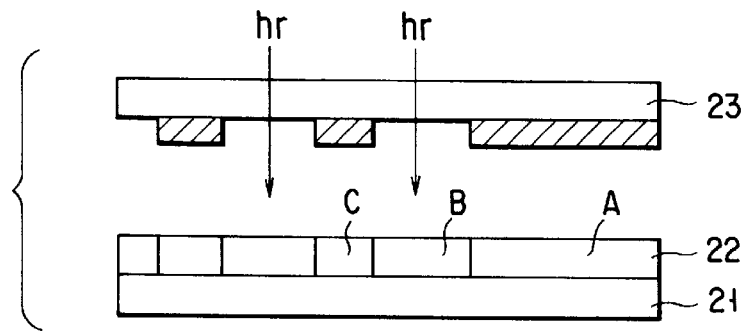
FIG. 3A
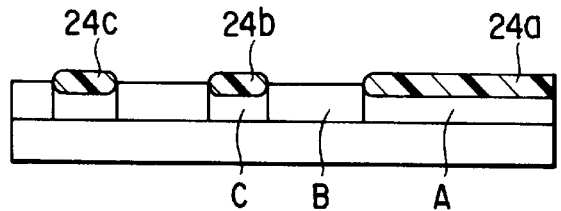
FIG. 3B
FIG. 3C
FIG. 3D
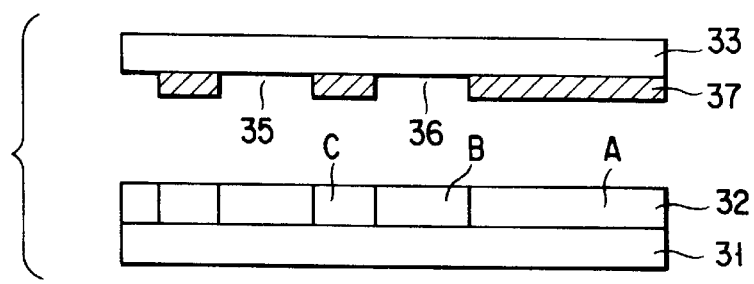
FIG. 4A
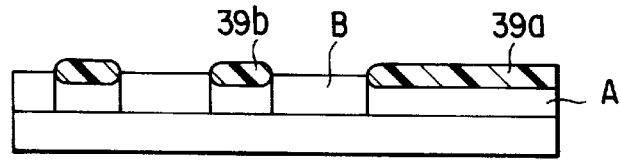
FIG. 4B
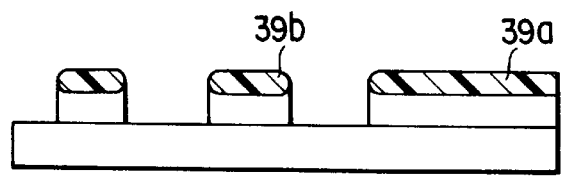
FIG. 4C

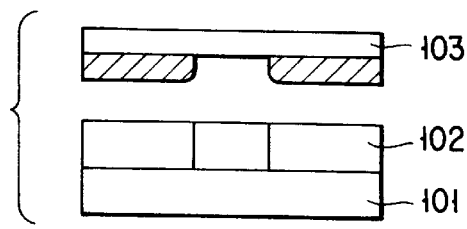
FIG. 11A
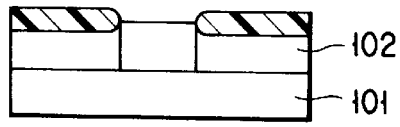
FIG. 11B
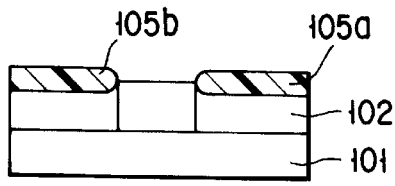
FIG. 11C
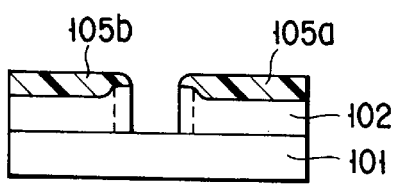
FIG. 11D
FIG. 12
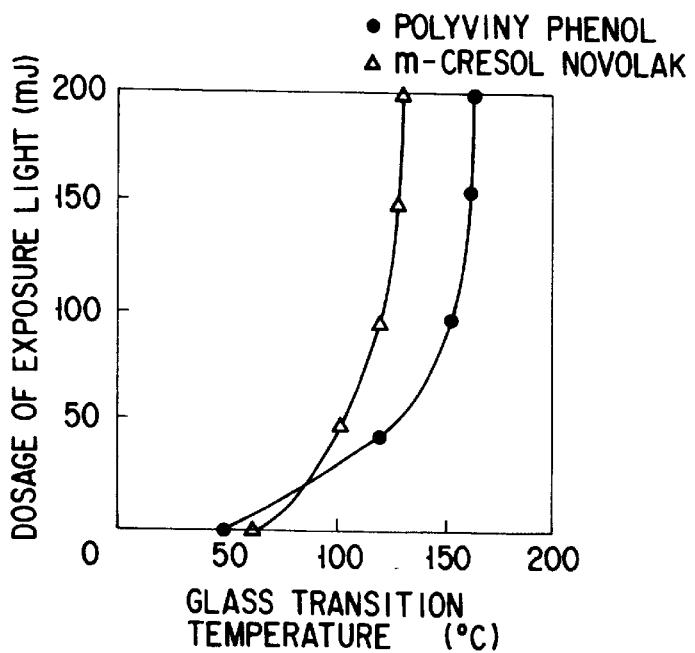

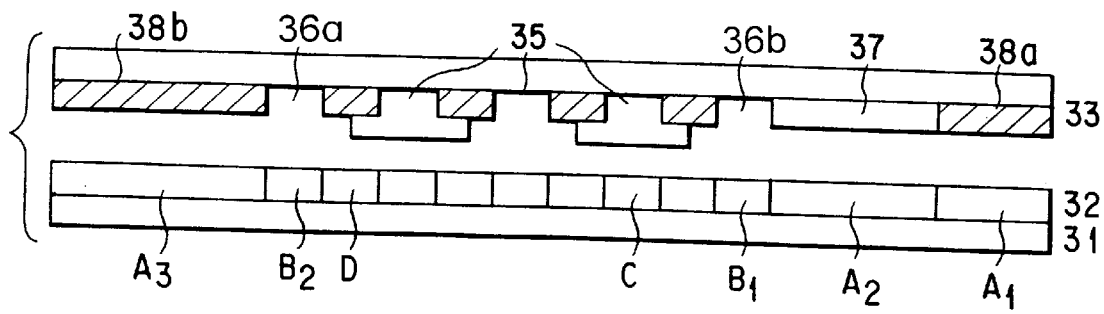
F I G. 13A
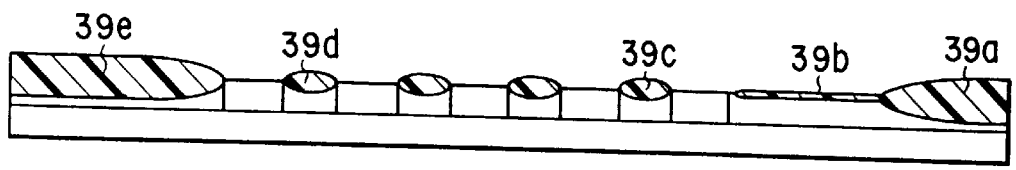
F I G. 13B
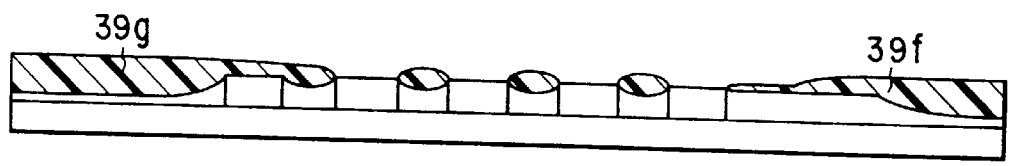
F I G. 13C
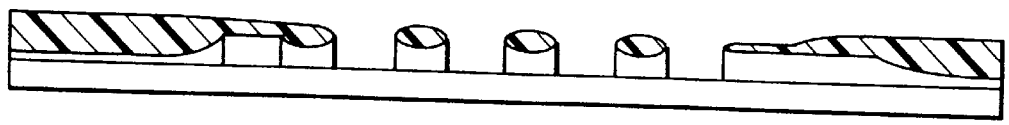
F I G. 13D

METHOD OF MANUFACTURING SEMICONDUCTOR DEVICE

BACKGROUND OF THE INVENTION

This invention relates to a method of manufacturing a semiconductor device, and in particular to a method of forming a fine pattern to be employed in the manufacture of a semiconductor device.

When it is difficult to form a pattern of desired shape due to a weak exposure light intensity as in the case of forming an outermost edge portion of a continuous pattern or forming an isolated pattern in the formation of a fine resist pattern on a substrate, the employment of an auxiliary pattern in a photomask has been proposed. Namely, there is known a patterning method wherein an auxiliary pattern 125 is formed on a mask 123 in addition to a desired pattern 124, as shown in FIG. 1A, so as to obtain a sufficient exposure light intensity. The reference numerals 121 and 122 in FIG. 1A represent a substrate and a photoresist, respectively.

However, when the auxiliary pattern 125 is formed on a mask 123, a redundant image 126 is caused to be formed on the photoresist 122 as shown in FIG. 1C. By the way, FIG. 1B illustrates a distribution of intensity of optical image passing through the mask 123.

The phenomenon that a redundant image 126 is transcribed onto a resist due to the specific pattern structure of the mask 123 is not restricted to the case where the auxiliary pattern 125 is formed on a mask 123, but can be also seen in a case where a positive Levenson phase-shifting mask is employed due to a phase-shifting effect at the edge portion of the shifter. It is also known that when a half-tone type phase-shifting mask is employed, a redundant pattern is caused to be formed on the outside of a predetermined pattern due to a secondary peak.

With a view to overcome this undesirable phenomenon of forming a redundant pattern in a photoresist, various methods have been proposed. For example, Japanese Patent Unexamined Publication H/5-204131 sets forth a method of eliminating a redundant pattern on the edge portion of the Levenson phase-shifting mask, wherein a light exposure is performed once on a wafer, and then the wafer is moved so as to be subjected to a light exposure again thereby to eliminate the redundant pattern. However, this method of forming a pattern is defective in that numerous procedures are required for forming a pattern.

In the case of providing an auxiliary pattern on both sides of an isolated pattern, there has been proposed, as described in Japanese Patent Unexamined Publication H/6-242594, a method of minimizing the width of the auxiliary pattern so as to prevent the auxiliary pattern from being resolved. However, this method is defective in that since the width of the auxiliary pattern is too narrow, it is impossible to assure a sufficient depth of focus.

In order to prevent a redundant secondary peak from being resolved in a resist in the case of forming a pattern by making use of a half-tone type phase-shifting mask, a method has been proposed in Japanese Patent Unexamined Publication H/6-337514 wherein part of the translucent portion is further applied with a translucent film having a lower transmittance than that of the translucent portion thereby inhibiting the resolving of the secondary peak in the resist. However, according to this method, a translucent film is required to be formed over a translucent film on the photomask, thus making the manufacture of the mask very difficult.

BRIEF SUMMARY OF THE INVENTION

Therefore, an object of the present invention is to provide a method of manufacturing a semiconductor device which is capable of easily preventing a redundant pattern from being resolved in a resist in the formation of a resist pattern.

Another object of the present invention is to provide a method of manufacturing a semiconductor device which is capable of improving a focal tolerance without inviting the resolving of a secondary peak in the formation of a contact hole pattern using a half-tone type phase-shifting mask.

Namely, this invention provides a method of manufacturing a semiconductor device, which comprises the steps of;

providing a photosensitive resin film having a first resin portion having a first glass transition temperature and a second resin portion having a second glass transition temperature which is higher than the first glass transition temperature;

exposing the photosensitive resin film to an intermediate temperature between the first glass transition temperature and the second glass transition temperature, thereby fluidizing a surface portion of the first resin portion so as to cover a part of the second resin portion neighboring the first resin porting with the fluidized resin; and developing the photosensitive resin film by making use of the first resin portion and the fluidized resin covering the part of second resin portion as a mask.

This invention also provides a method of manufacturing a semiconductor device, which comprises the steps of;

selectively silylating a photosensitive resin film by exposing the photosensitive resin film according to an exposure pattern thereby to form a silylated layer having a glass transition temperature which is lower than that of the photosensitive resin film and exposing the photosensitive resin film to an intermediate temperature between the glass transition temperature of the silylated layer and the glass transition temperature of the photosensitive resin film thereby fluidizing the silylated layer so as to cover a portion of the photosensitive resin film neighboring the silylated layer with the fluidized silylated layer; and developing the photosensitive resin film by making use of the silylated layer and by the fluidized silylated layer covering the portion of photosensitive resin film as a mask.

This invention further provides a method of manufacturing a semiconductor device, which comprises the steps of;

selectively silylating a photosensitive resin film by exposing the photosensitive resin film through a reticle provided on its edge portions with a plurality of auxiliary patterns thereby to form a silylated layer having a glass transition temperature which is lower than that of the photosensitive resin film and at the same time rendering an outside portion of the plurality of auxiliary patterns to be translucent thereby performing a weak exposure on a portion of the photosensitive resin film corresponding to the translucent outside portion to perform an insufficient silylation, whereby obtaining an insufficiently silylated layer; and at the same time, exposing the photosensitive resin film to an intermediate temperature between the glass transition temperature of the silylated layer and the glass transition temperature of the photosensitive resin film thereby fluidizing the silylated layer so as to cover a portion of the photosensitive resin film neighboring the silylated layer with the fluidized silylated layer, while preventing the insufficiently silylated layer from being fluidized; and developing the photosensitive resin film by making use of the silylated layer and the portion of photosensitive resin film covered by the fluidized silylated layer as a mask.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 3A to 3D show respectively a cross-sectional view illustrating in step-wise a silylation process after light exposure according to a method of this invention;

FIGS. 4A to 4C show respectively a cross-sectional view illustrating in step-wise a method of this invention wherein an auxiliary pattern is allowed to be resolved;

FIGS. 11A to 11D show respectively a cross-sectional view illustrating in step-wise a method of forming a resist pattern according to Example 8;

FIG. 12 is a graph illustrating a relationship between the quantity of exposure irradiated onto a resin and the glass transition temperature when the resin is silylated; and FIGS. 13A to 13D show respectively a cross-sectional view illustrating in step-wise a method of forming a resist pattern according to Example 2.

DETAILED DESCRIPTION OF THE INVENTION

Figure 1A:
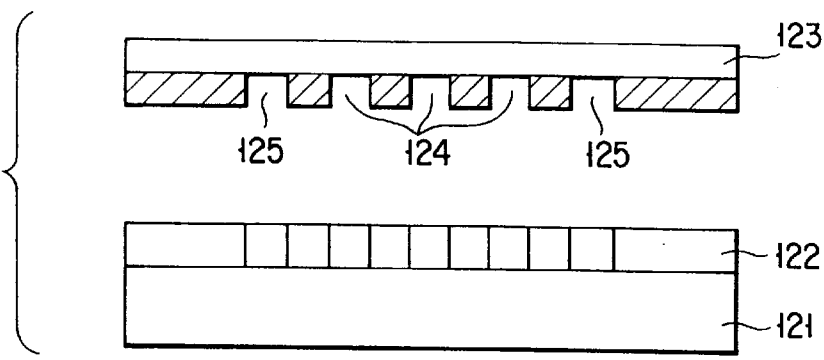
FIGS. 1A to 1C show respectively a cross-sectional view illustrating in step-wise a process of forming a resist pattern according to a conventional method.

The method of manufacturing a semiconductor device according to this invention is featured in that it comprises the steps of; providing a photosensitive resin film having a first resin portion having a first glass transition temperature and a second resin portion having a second glass transition temperature which is higher than said first glass transition temperature; exposing said photosensitive resin film to an intermediate temperature between said first glass transition temperature and said second glass transition temperature, thereby fluidizing a surface portion of said first resin portion so as to cover a part of said second resin portion neighboring said first resin portion with the fluidized resin; and developing said photosensitive resin film by making use of said first resin portion and said fluidized resin covering said part of second resin portion as a mask.

It is possible according to this invention to easily prevent a redundant pattern from being resolved in a resist.

Followings are specific embodiments of the aforementioned method according to this invention.

(1) The width of the first resin portion is at least twice as large as that of the second resin portion.

(2) The thickness of the first resin portion is larger than that of the second resin portion.

More specifically, the method of this invention is featured in that it comprises the steps of; selectively silylating a photosensitive resin film by exposing said photosensitive resin film according to an exposure pattern thereby to form a silylated layer having a glass transition temperature which is lower than that of said photosensitive resin film, exposing said photosensitive resin film to an intermediate temperature between the glass transition temperature of said silylated layer and the glass transition temperature of said photosensitive resin film thereby fluidizing said silylated layer so as to cover a portion of said photosensitive resin film neighboring said silylated layer with the fluidized silylated layer; and developing said photosensitive resin film by making use of said silylated layer and said fluidized silylated layer covering said portion of photosensitive resin film as a mask.

Followings are specific embodiments of the aforementioned method according to this invention.

(1) The development of the photosensitive resin film is performed by means of a dry development in a plasma containing oxygen.

(2) The unexposure portion of the photosensitive resin film is silylated.

(3) The exposure portion of the photosensitive resin film is silylated.

(4) In subsequent to the silylation of the photosensitive resin film, the photosensitive resin film is exposed to a temperature higher than the glass transition temperature of the silylated layer.

(5) The silylation reaction is performed at an intermediate temperature between the glass transition temperature of the silylated layer and the glass transition temperature of the photosensitive resin film.

(6) The silylation reaction is performed by making use of a silylating agent having a single functional group.

(7) The silylation reaction is performed by making use of a silylating agent having a plurality of functional groups in the same molecule.

(8) The photosensitive resin film is exposed to light using a reticle provided on the edge portions of pattern with an auxiliary pattern.

(9) The auxiliary pattern corresponds to a portion of the photosensitive resin film neighboring the silylated layer.

(10) The photosensitive resin film is exposed to light using a half-tone type phase-shifting mask.

(11) In the formation of a contact hole pattern in a photosensitive resin film, the photosensitive resin film is exposed to light using a mask provided with a hole pattern having a diameter which is smaller than a desired dimension.

When there is existed not only a pattern which is not desired to be resolved but also a pattern which is desired to be resolved, a portion neighboring the pattern which is desired to be resolved such as an outside portion thereof may be turned into a translucent film, and the portion of the photosensitive resin film corresponding to this translucent film is exposed to a weak light exposure so as to insufficiently silylate it, thereby inhibiting this insufficiently silylated portion from being fluidized.

Next, the method of manufacturing a semiconductor device of this invention will be explained in details.

The manufacturing method according to this invention is based on the following principle.

Figure 2:
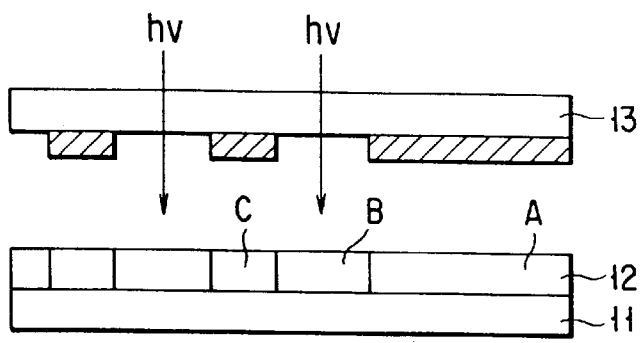
FIG. 2 is a cross-sectional view illustrating the principle of this invention.

As shown in FIG. 2, a resist film 12 formed on a work film (film to be worked) 11 is exposed to a light through a mask 13. In this case, when the glass transition temperature Tg(A) of unexposure portion A of the resist film 12 is lower than the glass transition temperature Tg(B) of exposure portion B of the resist film 12, i.e. Tg(A)<Tg(B), the unexposure portion A of the resist film 12 is caused to be fluidized as the resist film 12 is exposed to an intermediate temperature between Tg(A) and Tg(B), and the fluidized resist film is caused to flow toward the exposure portion B thereby to cover the exposure portion B with the fluidized resist film.

When the resist film 12 is subjected to a developing treatment under this condition, the exposure portion B which is originally to be removed so as to form a pattern therein is left remained together with the unexposure portions A and C, thus vanishing the pattern. In this case, the width of the portion A should preferably be at least twice as large as the pattern width of the portion B.

In order to realize the aforementioned method of this invention, the following silylating process after exposure can be utilized.

Namely, when a silylation reaction as shown by the following formula (1) is allowed to take place between a resist (a) and a silylating agent (b), a silylation linkage (c) is formed in the resist. Since the hydroxyl groups are linked via a hydrogen bond to the main chain in the resist resin, the glass transition temperature of the resist resin is originally high. However, when the resist resin is silylated, this hydrogen bond in the resin is vanished, so that the silylated portion of the resist resin becomes lower in glass transition temperature as compared with the glass transition temperature of the portion of resist which is not silylated. Accordingly, it is possible through this silylation to form portions neighboring each other but differing in glass transition temperature from each other within the same resist resin.

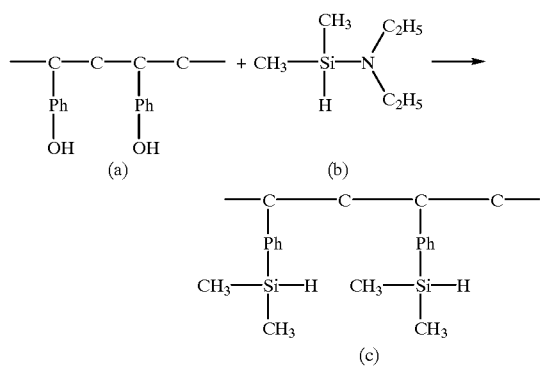

FIGS. 3A to 3D show respectively a cross-sectional view illustrating in step-wise the aforementioned silylation process after light exposure according to a method of this invention.

In this process, the work film is covered at first with a resin film having a functional group to be silylated. As for the functional group to be silylated, there is not any particular limitation as long as the functional group is provided with hydrogen which is reactive to a silylating agent. Specifically, —COOH—, —OH, —SH, —NH$_2$, etc. can be employed. As for the resin having such a functional group, a novolak type resin and polyvinylphenol type resin may be exemplified.

Then, any of these resins is dissolved in an organic solvent to obtain a solution. If desired, a thermal polymerization inhibitor, an adhesion improver for improving the adhesion to a substrate, a crosslinking agent such as melamine resin, an acid-generating agent such as sulfone imide and onium, a photosensitive agent such as diazonaphthoquinone, or a light-absorbing agent for absorbing exposure light such as a dye may be added to the solution.

As for the organic solvents, there is not any particular restriction as long as they are capable of dissolving the polymer. Specific examples of such an organic solvent are a polar solvent such as a ketone type solvent such as acetone, methyl ethyl ketone, methylisobutyl ketone and cyclohexanone; a cellosolve type solvent such as methylcellosolve, methylcellosolve acetate and ethylcellosolve acetate; an ester type solvent such as ethyl acetate, butyl acetate and isoamyl acetate; and a non-polar solvent such as toluene and xylene.

After the preparation of the aforementioned solution, the solution is coated on the surface of the work film and then heat-treated using a hot plate for instance thereby to form a resist film.

Then, as shown in FIG. 3A, a visible light or an energy beam such as ultraviolet ray is irradiated through a photomask 23 having a desired pattern onto a resist film 22 formed on a substrate 21. As for the light source for irradiating an exposure light, a mercury lamp and an excimer laser such as XeF (351 nm in wavelength), XeCl (308 nm in wavelength), KrF (248 nm in wavelength), KrCl (222 nm in wavelength), ArF (193 nm in wavelength), F$_2$ (151 nm in wavelength), etc. may be employed. It is also possible to employ as an exposure light X-ray or an electron beam.

Next, the details on the photomask to be employed in the method of this invention will be explained. The method of this invention makes it possible to prevent a redundant pattern of a photomask from being resolved in a photoresist, so that the method of this invention is applicable in particular to a photomask provided with an auxiliary pattern or to a photomask which is more likely to form a pattern of redundant secondary or higher peak on a resist in addition to a pattern which is desired in view of optical characteristics.

Specific examples of such a photomask among others are a Levenson type phase-shifting mask which is provided with an auxiliary pattern on the outside of a continuous pattern, an outrigger-Levenson type phase-shifting mask, a positive Levenson type phase-shifting mask and a half-tone type phase-shifting mask.

Examples of the pattern that is erasable or that can be eliminated in these masks are as follows. Namely, in the case of the Levenson type phase-shifting mask which is provided with an auxiliary pattern on the outside of a continuous pattern, the auxiliary pattern formed on outside of a continuous pattern is erasable. In the case of the outrigger-Levenson type phase-shifting mask, the auxiliary pattern formed on outside of a desired isolated pattern is erasable. In the case of the positive Levenson type phase-shifting mask, the narrow unexposed portion appearing on edge of an outermost shifter is erasable. In the case of the half-tone type phase-shifting mask, the secondary peak appearing on the outside of contact hole can be prevented from being resolved. As for the kind of pattern, it is not confined to a line-and-space pattern or a contact hole pattern.

When a contact hole is to be formed by making use of the half-tone type phase-shifting mask, the pattern can be designed smaller than a desired pattern so as to improve a focal tolerance. When the half-tone type phase-shifting mask is employed as a mask, a secondary peak is generally generated at the periphery of a desired pattern. However, when the method of this invention is employed, the silylated layer located on the outside of the secondary peak at the periphery of a desired pattern is caused to flow so as to cover the secondary peak portion, whereby preventing the secondary peak from being resolved in the resist.

Then, the unexposure portion is silylated by making use of a silylating agent thereby to form silylated layers 24a to 24c as shown in FIG. 3B. When the resist is silylated, the hydrogen bond in the resin molecule is lost, so that the glass transition temperature of the silylated layers 24a to 24c is decreased lower than the glass transition temperature of the exposure portion B. As a result, it is possible through the silylation of the resist to form portions neighboring each other but differing in glass transition temperature from each other within the same resist resin.

This silylation may be performed on the exposure portion in stead of performing on the unexposure portion. For example, the silylation of the exposure portion can be performed by activating an active hydrogen group such as —OH group which has been protected by t-butyl group, etc. by the irradiation of light thereby increasing active hydrogen group in the resin, thus allowing exposure portion to be selectively reacted with a silylating agent.

It is also possible, by the irradiation of light, to reduce the active hydrogen group in the resin through a radical polymerization of active hydrogen group such as —OH or through a crosslinking of active hydrogen in the resin, whereby selectively controlling the ratio in number of active hydrogen group between the exposure portion and the unexposure portion, thus allowing the unexposure portion to be reacted with a silylating agent.

As for the silylating method, a liquid phase silylating method wherein the resin layer is contacted with a solution of a silylating agent, or a vapor phase silylating method wherein the resin layer is contacted with a vaporized silylating agent may be employed.

As for the silylating agent, the following silylating agents may be employed singly or as a mixture of two or more kinds.

Namely, specific examples of silylating agent are dimethylaminodimethyl silane, diethylaminodimethyl silane, diethylaminotrimethyl silane, dimethylaminotrimethyl silane, bis(dimethylamino) methyl silane, bis(dimethylamino) dimethyl silane, hexamethyl disilane, tetramethyl silazane, hexamethyl cyclotrisilazane and other kinds of organometallic reagents.

As mentioned above, when the silylating reaction is performed, the silylating agent is reacted with and bonded to the active hydrogen in the resin film, thereby losing the active hydrogen group in the resin. As a result of the dissipation of hydrogen bond in the resin, the glass transition temperature of the resin is lowered. Accordingly, by taking advantage of a difference in glass transition temperature between the silylated portion and the un-silylated portion in the same resin, the silylation reaction of the resin can be performed at a temperature which is higher than the glass transition temperature Tg(A) of the silylated portion A but is lower than the glass transition temperature Tg(B) of the un-silylated portion B, thereby allowing the layer of A to flow over and cover the un-silylated portion B. It is also possible to perform the heating of the resin at a temperature which is higher than the temperature Tg(A) but is lower than the temperature Tg(B) in subsequent to the silylation reaction, thereby allowing the layer of A to flow over and cover the un-silylated portion B.

When a vapor phase silylation reaction is performed by making use of a silylating agent having a molecular structure wherein only one functional group is linked to a silicon atom of the silylating agent, such as dimethylaminodimethyl silane, diethylaminodimethyl silane, diethylaminotrimethyl silane, dimethylaminotrimethyl silane, hexamethyl disilane, tetramethyl silazane and hexamethyl cyclotrisilazane, the fluidization of the silylated layer generally takes place immediately during the silylation reaction, since the glass transition temperature of the resin layer silylated by these silylating agents becomes lower than the silylation reaction temperature.

Namely, the glass transition temperature of the resin silylated by these silylating agents is generally 60° C. or less, which is lower than a temperature required for the vapor phase silylation reaction (more than 60° C.), so that the fluidization of the silylated layer generally takes place immediately during the silylation reaction.

Whereas, when a vapor phase silylation reaction is performed by making use of a silylating agent having a molecular structure wherein plural functional groups are linked to a silicon atom of the silylating agent, such as bis(dimethylamino) methyl silane and bis(dimethylamino) dimethyl silane, a crosslinking reaction takes place since two or more bonding hands are extended from the silicon atom of the silylating agent. As a result, the glass transition temperature of the silylated resin generally becomes 120° C. or more, which is higher than the temperature of the ordinary vapor phase silylation reaction.

As mentioned above, when the resin layer is heated during or after the silylation reaction at an intermediate temperature between the temperature Tg(A) of the silylated layer and the temperature Tg(B) of the un-silylated portion, the silylated layer 24a is caused to flow thereby to cover the pattern B, thus forming a silylated layer 24 which is contiguous to the silylated layer 24b.

Subsequently, when a dry development is performed on the resin layer by means of an oxygen plasma, the pattern B can be dissipated while assuring the development of a desired pattern.

When the dark portion C of patterning portion is compared with the light-shielding portion A located outside the patterning portion with respect to the light intensity on the resist, the light intensity of the dark portion C of patterning portion is stronger than the light-shielding portion A due to the diffraction effect of light, so that the photo-initiated crosslinking is more advanced in the dark portion C than in the light-shielding portion A located outside the patterning portion.

Therefore, since the silylated layer 24b (24c) which is formed by a silylation of the dark portion C of patterning portion is more crosslinked than the silylated layer 24a which is formed by a silylation of the light-shielding portion A located outside the patterning portion, the silylated layer 24b of the patterning portion is higher in glass transition temperature as compared with the silylated layer 24a having a relatively large area and located outside the patterning portion. Accordingly, when the silylation reaction is performed at a temperature which is higher than the temperature Tg(A) but lower than the temperature Tg(B) or Tg(C), even if the portion of A is fluidized, the fluidization would not take place at the portions of B and C, thus maintaining the shape thereof formed at the moment of silylation and making it possible to obtain a high resolution.

As explained above, the method of this invention is applicable to the formation of a resist pattern employing a photomask provided with a redundant pattern such as an auxiliary pattern which is not desired to be resolved in a resist film, wherein the auxiliary pattern can be prevented from being resolved in the resist film.

There is a possibility, when the aforementioned method is applied to as it is, that not only the redundant pattern that is not desired to be resolved but also a pattern that is desired to be developed may be prevented from being resolved. Therefore, if there is a pattern which is desired to be developed is existed together with a redundant pattern in the auxiliary pattern that may be dissipated when the aforementioned method is applied to as it is, a process shown in FIGS. 13A to 13D can be employed.

Namely, as shown in FIG. 13A, some degree of transmittance is given in advance to a light-shielding portion 37 of the photomask 33 which corresponds to the portion $A_2$ of a resist film 32 formed on a substrate 31, and then the portion $A_2$ of a resist film 32 is exposed to a weak light. As a result, the silylated portion 39b of the pattern $A_2$ is weakly silylated and hence the silylated resist is prevented from flowing into the portion $B_1$ as shown in FIG. 13B. Though the thick silylated portion 39a corresponding to the unexposure portion $A_1$ is fluidized, the fluidized silylated portion does not reach to the exposure portion $B_1$. As a result, the silylated portion 39f is formed as shown in FIG. 13C. Subsequently, it is possible to form an auxiliary pattern after a dry development as shown in FIG. 13D.

On the other hand, since the portion $A_3$ is unexposured and fully silylated, the silylated layer 39e is fluidized when it is heated to a temperature higher than a glass transition temperature (Tg), covers the portion $B_2$, and reachs to the silylated layer 39d, thus forming the silylated layer 39g as shown in FIG. 13c. Subsequently, even if a dry development is performed, the auxiliary pattern $B_2$ is not transferred to the resist layer 32, as shown in FIG. 13D.

Thus, it is possible to perform selectively resolution or non-resolution of the suxiliary pattern in the same process.

Figure 1B:
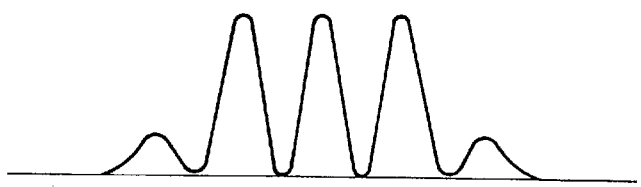
Figure 1C:
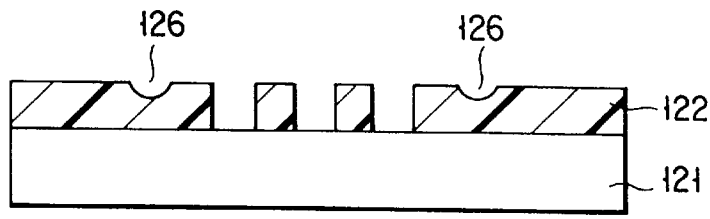

In the ordinary resist patterning process as shown in FIG. 1, the auxiliary pattern 126 is not fully resolved in the resist. However, when all auxiliary patterns need to be resolved in the resist, the silylation reaction is performed at a temperature which is lower than the temperature Tg(A) of the pattern A and also lower than the temperature Tg(B) of the pattern B. as shown in FIGS. 4A to 4C. As a result, the silylated layer 39a of the pattern A would be prevented from being fluidized, thus making it possible to develop all of the patterns.

As an alternative method of forming an auxiliary pattern of photomask on a resist film, a method of employing a silylating agent giving a high glass transition temperature after silylation may be adopted. If such a silylating agent is employed, an auxiliary pattern can be formed on a resist while preventing the resist from being fluidized.

These methods are applicable not only to the formation of a line-and-space pattern, but also to the formation of a contact hole pattern or the like on a resist.

In the foregoing explanation on the silylating method, the explanation is focused on the method of silylating only the unexposure portion of resin layer. However, this silylating method is also applicable to the method of silylating only the exposure portion. Furthermore, this silylating method is applicable not only to the formation of a resist pattern on a silicon wafer, but also to the manufacture of a photomask.

Then, the resist resin portion is subjected to a dry development employing an oxygen plasma by making use of the silylated layer as a mask thereby to form a pattern. When a dry development is to be performed by making use of a silylated layer as a mask, the surface layer of the resin is, as a first step of dry development, generally etched away to a depth of several tens nanometers by making use of a CF-based gas such as $CF_4$ or $C_4F_8$, or an Ar plasma, since the surface of exposure or un-exposure portion which is selectively prevented from being silylated is actually caused to be reacted or diffused with a silylating agent to a depth of several tens nanometers. In this case, if the condition for the etching of this first step is too strong, the silylated layer covering the portion B may be etched away, so that an optimum etching condition for this first step is required to be determined.

In subsequent to the aforementioned first step, an etching by means of an oxygen plasma is performed as a second step. Since the oxygen plasma tends to become unstable in plasma intensity, an inert gas such as argon and helium; nitrogen gas; or a gas containing carbon dioxide, sulfur dioxide, nitrogen dioxide or oxygen may be added to the oxygen gas so as to stabilize the plasma.

As for the etching apparatus useful in this case, an etching apparatus provided with an independent bias such as ICP or TCP as a plasma-generating source; a magnetron RIE etching apparatus; or an etching apparatus exhibiting a high selectivity can be preferably employed. Of course, the etching apparatus useful in this case is not confined to the aforementioned apparatuses.

As explained above, a portion of mask which is not desired to be resolved in a resist resin, such as an auxiliary pattern in a Levenson mask, an auxiliary pattern in a chromium mask, a side lobe in a half-tone mask can be prevented from being resolved in a resist mask by the method of this invention. On the other hand, if there is a pattern portion which is desired to be resolved, the pattern portion can be resolved to a resist resin by making use of a gray mask which enables light to be partially transmitted as a light-shielding portion, or by making use of a silylating agent which is capable of making the glass transition temperature higher after silylation.

By the way, the reaction which causes a difference in glass transition temperature is not confined to the silylation reaction, but may be selected from any other kinds of reaction as long as they are capable of generating a difference in glass transition temperature between the portion A and the portion B.

This invention will be further explained with reference to the following various examples.

(Example 1)

Figure 5A:
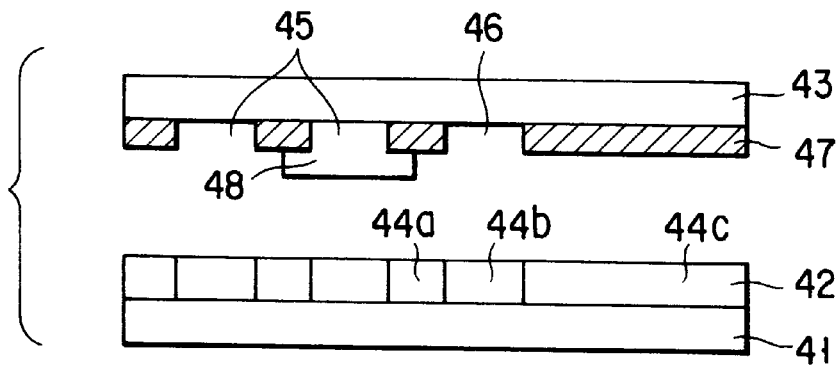
FIGS. 5A to 5C show respectively a cross-sectional view illustrating in step-wise a method of forming a resist pattern according to Example 1.
Figure 5B:
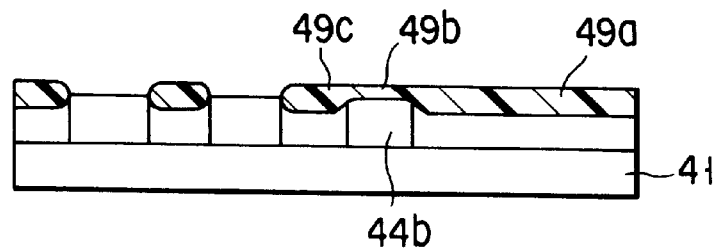
Figure 5C:
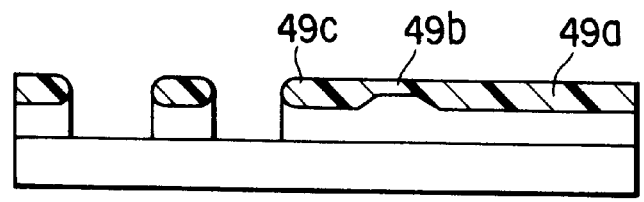

FIGS. 5A to 5C show respectively a cross-sectional view illustrating in step-wise a method of forming a resist pattern according to a first example of this invention.

As shown in FIG. 5A, a resist (MX-P8, Microlithography Chemical Co., Ltd.) was coated by making use of a spin-coater (Mark-V, Tokyo Electron Co., Ltd.) on a silicon wafer 41 and baked at a temperature of 100° C. for 90 seconds to form a resist film 42. The film thickness of the resist film 42 after baking was found to be 500 nm.

Then, the resist film 42 was subjected to a patterning exposure through a photomask 43 by making use of an ArF excimer laser stepper thereby to allow the exposure portions to undergo a crosslinking reaction. The dosage of exposure was 200 mJ/cm$^2$. In FIG. 5A, the reference numeral 44a denotes an exposure portion which was exposed through an ordinary pattern, 44b represents an exposure portion which was exposed through an auxiliary pattern, and 44c indicates an un-exposure portion.

The photomask 43 employed in this case was provided with a line-and-space pattern 45 having a line width of 0.15 μm which was formed by means of Levenson type phase-shifting method. A pattern 46 having the same size as that of a continuous pattern was formed as an auxiliary pattern on each of the outermost sides of the continuous pattern. A light-shielding portion 47 covered with a chromium film having a width of 0.5 μm was formed on outside of the auxiliary pattern 46. Reference numeral 48 denotes a shifter.

Then, the silylation of resist film after exposure was performed in a silylation apparatus (MicroStar 200C, Genesis Co., Ltd.). Specifically, the vacuum chamber for silylation reaction in which a silicon wafer was housed was evacuated to 5 Torr and heated up to 100° C. Then, a vapor obtained by heating diethylaminodimethyl silane (DMSDEA) up to 50° C. was introduced as a silylating agent into the vacuum chamber thereby allowing a silylation reaction to take place therein. At this moment, the temperature of wafer was 100° C., the partial pressure of silylating agent in the chamber was 80 Torr, and the silylating reaction was performed by exposing the resist film 42 on the silicon wafer to the vapor of the silylating agent for 90 seconds.

As a result, the un-exposure portion 44c of the resist film 42 was reacted with diethylaminodimethyl silane, thus decreasing the glass transition temperature thereof down to 60° C. Accordingly, the un-exposure portion 44c was fluidized immediately after the silylation reaction, thereby covering the exposure portion 44b which was exposed through the auxiliary pattern and forming silylated layers 49a, 49b and 49c extending over the un-exposure portion 44a. By the way, the glass transition temperature of the exposure portion 44b which was exposed through the auxiliary pattern 46 was found to be 180° C.

When the cross-section of the resist film was observed by means of SEM after the silylation reaction, the thickness of the silylated layer 49a was found to be 100 nm, while the thickness of the silylated layer 49c was found to be 300 nm. On the other hand, the thickness of the silylated layer 49b which was formed with a silylated resin flow from the silylated layer 49c during the silylation reaction, thus covering the exposure portion 44b, was found to be 80 nm.

Then, a dry development using an O$_2$ gas plasma was performed in a dry etching apparatus (TCP9400, Lam Research Co., Ltd.) by making use of the silylated layers 49a, 49b and 49c as an etching mask, whereby forming a pattern. Specifically, first of all, the etching was performed for 15 seconds under the etching conditions; 150 W in TCP power, 20 sccm in CF$_4$ gas flow rate, 5 mTorr in pressure and 100 W in RF bias, thereby etching away the silylated layer 10 nm in thickness on the surface of the resist.

Then, an etching was performed for 60 seconds under the etching conditions; 300 W in TCP power, 20 sccm in O$_2$ gas flow rate, 50 sccm in He gas flow rate, 5 mTorr in pressure and 100 W in RF bias, thereby forming a line-and-space pattern having a line width of 0.15 μm as shown in FIG. 5C.

Since the exposure portion 44b which was irradiated with light through an auxiliary pattern 46 having a line width of 0.5 μm was covered by the silylated layer 49b, the pattern of the exposure portion 44b was not formed on the resist.

(Example 2)

A method of forming a resist pattern according to a second example of this invention will be explained with reference to FIGS. 13A to 13D.

This example illustrates a case where an auxiliary pattern that is not desired to be resolved is coexisted with an auxiliary pattern that is desired to be resolved, and provides a method of selectively forming the image of the auxiliary pattern that is desired to be resolved. As shown in FIG. 13A, a resist (MX-P8, Microlithography Chemical Co., Ltd.) was coated by making use of a spin-coater (ACT-8, Tokyo Electron Co., Ltd.) on a silicon wafer 31 and baked at a temperature of 100° C. for 90 seconds to form a resist film 32. The film thickness of the resist film 32 after baking was found to be 300 nm.

Then, the resist film 32 was subjected to a patterning exposure through a photomask 33 by making use of an ArF excimer laser stepper thereby to allow the exposure portions to undergo a crosslinking reaction. The dosage of exposure was 150 mJ/cm$^2$.

The photomask 33 employed in this case was provided with a line-and-space pattern 35 having a line width of 0.15 μm which was formed by means of Levenson type phase-shifting method. Patterns 36a, 36b having the same size as that of a continuous pattern was formed as an auxiliary pattern on each of the outermost sides of the continuous pattern. For the purpose of leaving the auxiliary pattern 36b, a mask is provided with a translucent film 37 having a light transmittance of 30% and a width of 0.5 μm between the auxiliary pattern 36b and light-shielding film 38a on the other hand, for the eliminating of the auxiliary pattern 36a, a mask is provided with a light-shielding film 38b on outside of the auxiliary pattern 36a.

Then, the silylation of resist film after exposure was performed in a silylation apparatus (MicroStar 200C, Genesis Co., Ltd.). Specifically, the vacuum chamber for silylation reaction in which a silicon wafer was housed was evacuated to 5 Torr and heated up to 100° C. Then, a vapor obtained by heating diethylaminodimethyl silane (DMSDEA) up to 50° C. was introduced as a silylating agent into the vacuum chamber thereby allowing a silylation reaction to take place therein. At this moment, the temperature of wafer was 100° C., the partial pressure of silylating agent in the chamber was 80 Torr, and the silylating reaction was performed by exposing the resist film 32 on the silicon wafer 31 to the vapor of the silylating agent for 90 seconds.

When the cross-section of the resist film 32 was observed by means of SEM after the silylation reaction, the thickness of the silylated layer 39a of the un-exposure portion $A_1$ was found to be 180 nm, while the thickness of the silylated layer 39b of the portion $A_2$ which corresponded with the translucent portion 37 was found to be 40 nm, so that the silylated layer 39a was fluidized not to reach to the exposure portion $B_1$ which was exposed to light through the auxiliary pattern, and thus forming the silylated layer 39f.

On the other hand, since the silylated layer 39e of the exposrure portion $A_3$ has a thickness of 180 mm, un-exposure portion 39e flows directly after silylation, to form the silylated layer 39g covering the exposure portion $B_2$ exposed through the auxiliary pattern 36a and reaching to the silylated layer 39g of the un-exposure portion D.

Then, a dry development using an O$_2$ gas plasma was performed in a dry etching apparatus (TCP9400, Lam Research Co., Ltd.) by making use of the silylated portions as an etching mask, whereby forming a pattern. Specifically, first of all, the etching was performed for 15 seconds under the etching conditions; 150 W in TCP power, 20 sccm in CF$_4$ gas flow rate, 5 mTorr in pressure and 100 W in RF bias, thereby etching away the silylated layer 10 nm in thickness on the surface of the resist.

Then, an etching was performed for 60 seconds under the etching conditions; 300 W in TCP power, 20 sccm in $O_2$ gas flow rate, 50 sccm in He gas flow rate, 5 mTorr in pressure and 100 W in RF bias, thereby forming a line-and-space pattern having a line width of 0.15 µm as shown in FIG. 4C. It was also possible to transfer the pattern of the auxiliary pattern; which was located between the translucent film 37 having a light transmittance of 30% and the auxiliary pattern 36b, to the exposed portion $B_2$ of the rest without transferring the auxiliary pattern 36a located inside of the light-shielding film 38b to the exposed portion $B_2$ of the resist.

(Example 3)

A method of forming a resist pattern according to a third example of this invention will be explained with reference to FIGS. 4A to 4C.

This example illustrates a case where all auxiliary patterns are desired to be resolved in to the resist film. As shown in FIG. 4A, a resist (MX-P8, Microlithography Chemical Co., Ltd.) was coated by making use of a spin-coater (Mark-V, Tokyo Electron Co., Ltd.) on a silicon wafer 31 and baked at a temperature of 100° C. for 90 seconds to form a resist film 32. The film thickness of the resist film 32 after baking was found to be 300 nm.

Then, the resist film 32 was subjected to a patterning exposure through a photomask 33 by making use of an ArF excimer laser stepper thereby to allow the exposure portions to undergo a crosslinking reaction. The dosage of exposure was 150 mJ/cm².

The photomask 33 employed in this case was provided with a line-and-space pattern 35 having a line width of 0.15 µm which was formed by means of Levenson type phase-shifting method. A pattern 36 having the same size as that of a continuous pattern was formed as an auxiliary pattern on each of the outermost sides of the continuous pattern.

Then, the silylation of resist film after exposure was performed in a silylation apparatus (MicroStar 200C, Genesis Co., Ltd.). Specifically, the vacuum chamber for silylation reaction in which a silicon wafer was housed was evacuated to 5 Torr and heated up to 100° C. Then, a vapor obtained by heating a mixture of 70% of diethylaminodimethyl silane (DMSDEA) and 30% of bis (dimethylamino) methyl silane up to 80° C. was introduced as a silylating agent into the vacuum chamber thereby allowing a silylation reaction to take place therein. At this moment, the temperature of wafer was 100° C., the partial pressure of silylating agent in the chamber was 80 Torr, and the silylating reaction was performed by exposing the resist film 32 on the silicon wafer to the vapor of the silylating agent for 90 seconds.

When the cross-section of the resist film 32 was observed by means of SEM after the silylation reaction, since the silylated layers 39a and 39b have glass transition temperature of 125° C. and 135° C., respectively, the silylated layer 39a heated to 100° C. was not fluidized and the exposure portion B which was exposed to light through the auxiliary pattern was not covered at all.

Then, a dry development using an $O_2$ gas plasma was performed in a dry etching apparatus (TCP9400, Ram Research Co., Ltd.) by making use of the silylated portions as an etching mask, whereby forming a pattern. Specifically, first of all, the etching was performed for 15 seconds under the etching conditions; 150 W in TCP power, 20 sccm in $CF_4$ gas flow rate, 5 mTorr in pressure and 100 W in RF bias, thereby etching away the silylated layer 10 nm in thickness on the surface of the resist.

Then, an etching was performed for 60 seconds under the etching conditions; 300 W in TCP power, 20 sccm in $O_2$ gas flow rate, 50 sccm in He gas flow rate, 5 mTorr in pressure and 100 W in RF bias, thereby forming a line-and-space pattern having a line width of 0.15 µm and including the auxiliary pattern B as shown in FIG. 4C.

(Example 4)

First of all, a resist film having a film thickness of 500 nm was formed on a silicon wafer.

Figure 6:
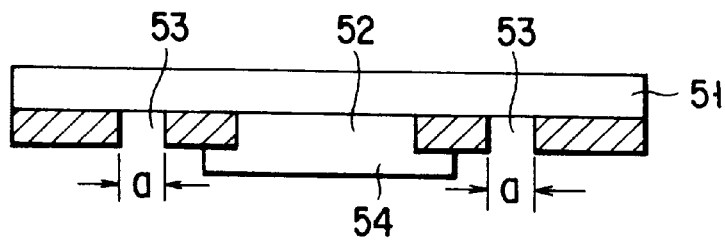
FIG. 6 is a cross-sectional view illustrating an outrigger type mask employed in Example 4.

Then, the resist film was subjected to an exposure through a photomask by making use of an ArF excimer laser stepper (NA=0.6, σ=0.3). FIG. 6 shows the photomask employed in this case. Referring to FIG. 6, the pattern representing the exposure portion of the photomask 51 was an isolated pattern 52 having a line width of 150 nm which was formed by means of outrigger-Levenson type phase-shifting method, and an auxiliary pattern 53 was formed on both sides of the isolated pattern 52. The reference numeral 54 denotes a shifter.

Figure 7:
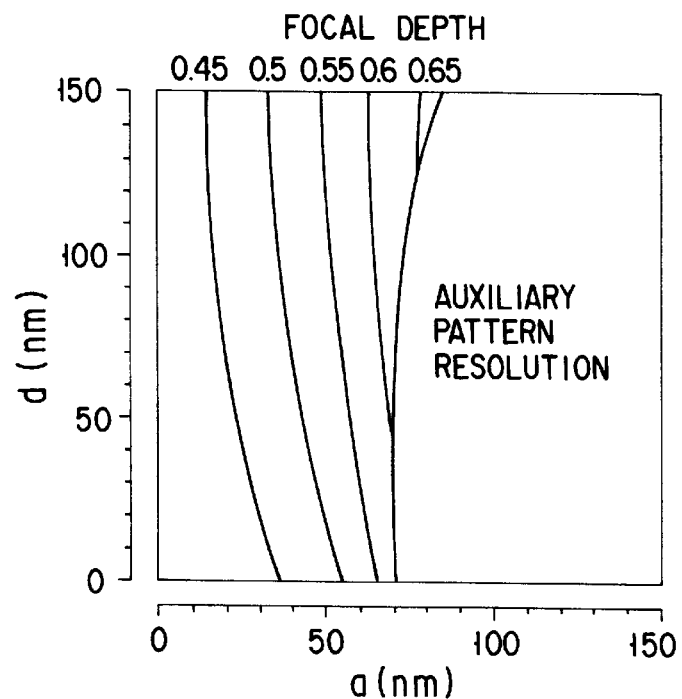
FIG. 7 is a graph illustrating the dependency of depth of focus on the size of the opening of an auxiliary pattern of an outrigger type mask.

When the dependency of depth of focus on the opening size of the auxiliary pattern of the outrigger type mask shown in FIG. 6 was investigated, the results shown in FIG. 7 was obtained. As shown in FIG. 7, in the case of the ordinary process of forming a resist pattern, although the depth of focus becomes larger as the width "a" of the auxiliary pattern is increased, the auxiliary pattern is caused to be resolved. On the other hand, when the width "a" of the auxiliary pattern is reduced to 50 nm or less, the depth of focus is undesirably decreased to 0.55 µm or less. By contrast, in the case of the method of this invention, since the auxiliary pattern is not transferred, the width "a" of the auxiliary pattern is set to 100 nm so as to ensure a sufficient depth of focus.

Then, the silylation of resist film after exposure was performed in a silylation apparatus (MicroStar 200C, Genesis Co., Ltd.). Specifically, the vacuum chamber for silylation reaction in which a silicon wafer was housed was evacuated to 5 Torr and heated up to 100° C. Then, a vapor obtained by heating diethylaminodimethyl silane (DMSDEA) up to 50° C. was introduced as a silylating agent into the vacuum chamber thereby allowing a silylation reaction to take place therein. At this moment, the temperature of wafer was 100° C., the partial pressure of silylating agent in the chamber was 80 Torr, and the silylating reaction was performed by exposing the resist film on the silicon wafer to the vapor of the silylating agent for 90 seconds.

Since the glass transition temperature of the un-exposure portion located outside the auxiliary pattern was 60° C., while the glass transition temperature of the resist portion which was exposed through the auxiliary pattern was 180° C., the silylated portion located outside the auxiliary pattern was caused to fluidize whereby covering the exposure portion which was exposed through the auxiliary pattern. Therefore, when the cross-section of the resist film was observed by means of SEM after the silylation reaction, the thickness of the silylated layer which was formed on the un-exposure portion of the resist film corresponding to the light-shielding portions located on both sides of the isolated pattern 52 was found to be 300 nm, while the thickness of the silylated layer corresponding to the portion of the shifter was found to be 100 nm.

Then, a dry development using an $O_2$ gas plasma was performed in a dry etching apparatus (TCP9400, Lam Research Co., Ltd.) by making use of the silylated portions as an etching mask, whereby forming a pattern. Specifically, first of all, the etching was performed for 15 seconds under the etching conditions; 150 W in TCP power, 20 sccm in $CF_4$ gas flow rate, 5 mTorr in pressure and 100 W in RF bias, thereby etching away the silylated layer 10 nm in thickness on the surface of the resist.

Then, an etching was performed for 60 seconds under the etching conditions; 300 W in TCP power, 20 sccm in $O_2$ gas flow rate, 50 sccm in He gas flow rate, 5 mTorr in pressure and 100 W in RF bias, thereby forming an isolated pattern having a line width of 0.15 µm. However, the auxiliary pattern was not formed on the resist.

(Example 5)

FIGS. 8A to 8D show respectively a cross-sectional view illustrating in step-wise a method of forming a resist pattern according to a fifth example of this invention.

Figure 8A:
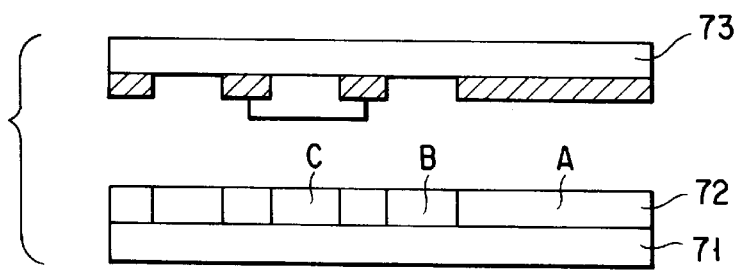
FIGS. 8A to 8D show respectively a cross-sectional view illustrating in step-wise a method of forming a resist pattern according to Example 5.

As shown in FIG. 8A, a resist (MX-P7, Microlithography Chemical Co., Ltd.) was coated by making use of a spin-coater (Mark-V, Tokyo Electron Co., Ltd.) on a silicon wafer 71 and baked at a temperature of 100° C. for 90 seconds to form a resist film 72. The film thickness of the resist film 72 after baking was found to be 500 nm.

Then, by making use of the mask 73 of the kind as employed in Example 1, the resist film 72 was subjected to a patterning exposure by means of an ArF excimer laser stepper thereby to allow the exposure portions to undergo a crosslinking reaction. The dosage of exposure was 300 mJ/cm². In FIG. 8A, the reference symbol "A" denotes an un-exposure portion, "B" represents an exposure portion which was exposed through an auxiliary pattern, and "C" indicates an exposure portion which was exposed through an ordinary pattern.

Figure 8B:
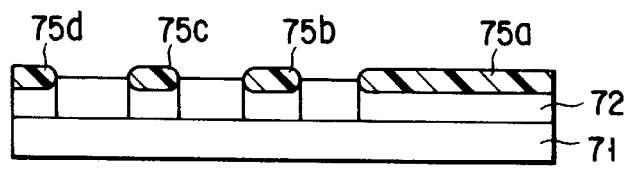

Then, the silylation of resist film was performed at a temperature of 120° C. in a silylation apparatus (MicroStar 200C, Genesis Co., Ltd.). Specifically, the vacuum chamber for silylation reaction in which a silicon wafer was housed was evacuated to 5 Torr and heated up to 120° C. Then, a vapor obtained by heating a mixture consisting of 70% of diethylaminodimethyl silane and 30% of bis (dimethylamino) methylsilane up to 80° C. was introduced as a silylating agent into the vacuum chamber thereby allowing a silylation reaction to take place therein. At this moment, the temperature of wafer was 120° C., the partial pressure of silylating agent in the chamber was 80 Torr, and the silylating reaction was performed by exposing the resist film 72 on the silicon wafer 71 to the vapor of the silylating agent for 90 seconds. As a result, silylated layers 75a, 75b, 75c and 75d were formed on the surface of the un-exposure portion as shown in FIG. 8B.

Figure 8C:
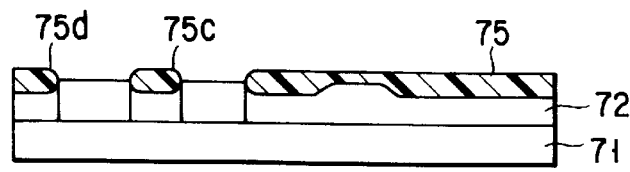

Since the glass transition temperature of the silylated layer 75a was 125° C. and the glass transition temperature of both silylated layers 75c and 75d was 135° C., the resist film was heated after the silylation at a temperature of 130° C. for 60 seconds, thereby causing the silylated layer 75a to fluidize so as to cover the auxiliary pattern B neighboring on the 100% light-shielding portion with the silylated layer 75 as shown in FIG. 8C.

Then, a dry development using an $O_2$ gas plasma was performed in a dry etching apparatus (TCP9400, Lam Research Co., Ltd.), whereby forming a pattern. Specifically, first of all, the etching was performed for 15 seconds under the etching conditions; 200 W in bias power, 50 sccm in $CF_4$ gas flow rate, 0.5 mTorr in pressure and 100 W in RF bias, thereby etching away the silylated layer 10 nm in thickness on the surface of the resist film 72.

Figure 8D:
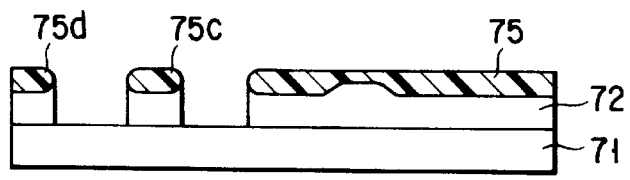

Then, as shown in FIG. 8D, an etching of the resist film 72 was performed by making use of the silylated layers 75, 75c and 75d as a mask for 60 seconds under the etching conditions; 200 W in bias power, 50 sccm in $O_2$ gas flow rate, 0.5 mTorr in pressure and 50 W in RF bias, thereby forming a line-and-space pattern having a line width of 0.15 µm.

As a result, as in the case of Example 1, due to the presence of the silylated layer covering over the auxiliary pattern, the auxiliary pattern was not formed on the resist film 72. Further, as in the case of Example 2, when a mask provided with a translucent film having a light transmittance of 20% and formed outside of the auxiliary pattern was employed, it was possible to form the auxiliary pattern on the resist film.

(Example 6)

Figure 9A:
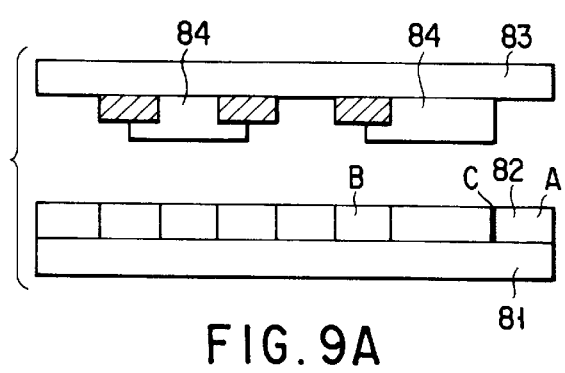
FIGS. 9A to 9C show respectively a cross-sectional view illustrating in step-wise a method of forming a resist pattern according to Example 6.
Figure 9B:
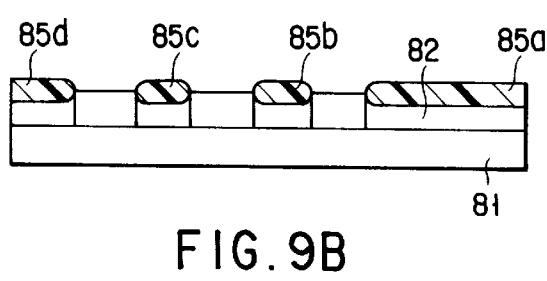
Figure 9C:
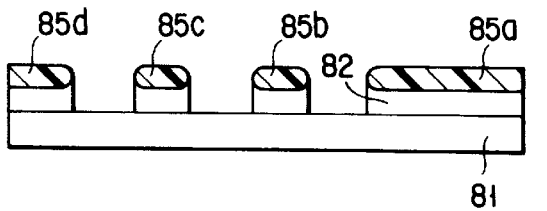

FIGS. 9A to 9C show respectively a cross-sectional view illustrating in step-wise a method of forming a resist pattern according to a sixth example of this invention.

As shown in FIG. 9A, a resin comprising polymethyl methacrylate protected with t-butyl and an acid-generating agent consisting of triphenylsulfonium triflate was spin-coated on a silicon wafer 81 and baked at a temperature of 100° C. for 90 seconds to form a resist film 82. The film thickness of the resist film 82 after baking was found to be 500 nm.

Then, by making use of a positive Levenson type phase-shifting mask 83, the resist film 82 was subjected to a patterning exposure at a dosage of 50 mJ/cm² by means of an ArF excimer laser stepper thereby eliminating the t-butyl group in the exposure portion A.

In FIG. 9A, the reference numeral 84 denotes a shifter, the symbol "B" represents an un-exposure portion of the resist, and "C" indicates a shifter edge.

Then, the silylation of resist film thus exposed was performed in a silylation apparatus (MicroStar 200C, Genesis Co., Ltd.). Specifically, the vacuum chamber for silylation reaction in which a silicon wafer 81 was housed was evacuated to 5 Torr and heated up to 100° C. Then, a vapor obtained by heating diethylaminodimethyl silane (DMSDEA) up to 80° C. was introduced as a silylating agent into the vacuum chamber thereby allowing a silylation reaction to take place therein. At this moment, the temperature of wafer was 100° C., the partial pressure of silylating agent in the chamber was 80 Torr, and the silylating reaction was performed by exposing the resist film 82 on the silicon wafer 81 to the vapor of the silylating agent for 90 seconds. As a result, the exposure portion A was silylated and at the same time, the silylated layer thereof was fluidized to cover the shifter edge C, thus forming a silylated layer 85a. At the same time, silylated layers 85b, 85c and 85d were formed as shown in FIG. 9B.

Then, a dry development using an $O_2$ gas plasma was performed in a dry etching apparatus (TCP9400, Lam Research Co., Ltd.), whereby forming a pattern. Specifically, first of all, the etching was performed for 15 seconds under the etching conditions; 200 W in bias power, 50 sccm in $CF_4$ gas flow rate, 5 mTorr in pressure and 100 W in RF bias, thereby etching away the silylated layer 10 nm in thickness on the surface of the resist film 82.

Then, an etching of the resist film 82 was performed by making use of the silylated layers 85a, 85b, 85c and 85d as a mask for 60 seconds under the etching conditions; 200 W in bias power, 50 sccm in $O_2$ gas flow rate, 0.5 mTorr in pressure and 50 W in RF bias, thereby forming a line-and-space pattern having a line width of 0.15 µm as shown in FIG. 9C.

As a result, due to the presence of the silylated layer 85a covering over the shifter edge C, the redundant shifter edge C was not formed on the resist film 82.

(Example 7)

This example is related to the formation of a contact hole, and will be explained with reference to FIGS. 10A to 10E.

Figure 10A:
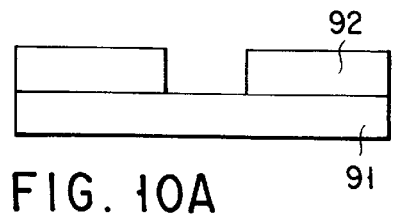
FIGS. 10A to 10E show respectively a cross-sectional view illustrating in step-wise a method of forming a resist pattern according to Example 7.

FIG. 10A shows a resist pattern 92 which was formed on a silicon wafer 91 according to this example. The dimension of a desirable contact hole pattern was set to 0.3 μm square on the wafer, and the size of hole was set to 1:3 in pitch (pitch=1:3).

Figure 10B:
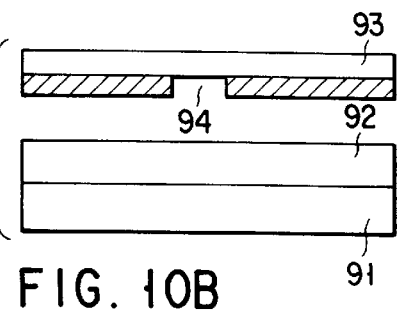

As shown in FIG. 10B, a resist film 92 was coated to a thickness of 500 nm on the substrate 91, and then subjected to a reduction exposure (¼) by making use of a half-tone type phase-shifting mask 93 having a light transmittance of 6% as a mask and an excimer laser exposure apparatus (KrF, NA=0.6, σ=0.4, ordinary illumination). The dimension of the hole 94 of mask 93 was set to 0.25 μm, which was smaller than desired in order to enlarge the focal tolerance as explained with reference to FIG. 2.

Figure 10C:
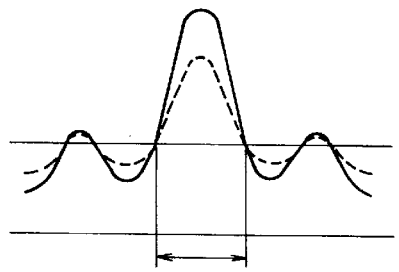

FIG. 10C illustrates the distribution of intensity of image when the aforementioned mask was employed. The solid line in FIG. 10 represents an optical image at the moment of just focus, while the broken line represents an optical image at the moment of defocus. As shown in FIG. 10C, a secondary peak is developed on the side of main peak, so that if the resist is developed as it is according to the ordinary method as in the case where a chemical amplification type resist is employed, a side lobe would be also developed.

After the step of exposure, the silylation of the un-exposure portion of resist film was performed in a silylation apparatus (MicroStar 200C, Genesis Co., Ltd.). Specifically, the vacuum chamber for silylation reaction in which a silicon wafer 81 was housed was evacuated to 5 Torr and heated up to 70° C. Then, a vapor obtained by heating diethylaminodimethyl silane (DMSDEA) up to 50° C. was introduced as a silylating agent into the vacuum chamber thereby allowing a silylation reaction to take place therein. At this moment, the temperature of wafer was 70° C., the partial pressure of silylating agent in the chamber was 60 Torr, and the silylating reaction was performed by exposing the resist film 92 on the silicon wafer 91 to the vapor of the silylating agent for 60 seconds. As a result, silylated layers 95a and 95b were formed on the un-exposure portion of the resist film 92.

Then, a dry development using an $O_2$ gas plasma was performed in a dry etching apparatus (TCP9400, Lam Research Co., Ltd.), whereby forming a pattern. Specifically, first of all, the etching was performed for 15 seconds under the etching conditions; 150 W in TCP power, 20 sccm in $CF_4$ gas flow rate, 5 mTorr in pressure and 100 W in RF bias, thereby etching away the silylated layer 10 nm in thickness on the surface of the resist film 92.

Then, an etching of the resist film 92 was performed by making use of the silylated layers 95a and 95b as a mask for 60 seconds under the etching conditions; 300 W in TCP power, 20 sccm in $O_2$ gas flow rate, 50 sccm in He gas flow rate, 5 mTorr in pressure and 100 W in RF bias, thereby forming a contact hole pattern of 0.30 μm square.

Figure 10D:
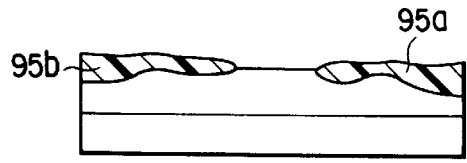
Figure 10E:
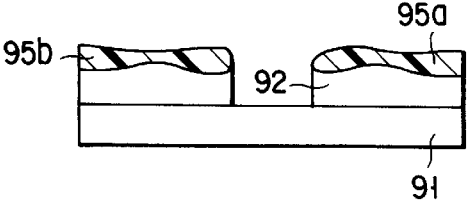

As a result, as shown in FIG. 10E, it was possible to obtain a desired pattern which was free from a side lobe due to a secondary peak which might be formed when a chemical amplification type resist is employed. In this case, it was possible to make a focal tolerance as large as 1.1 μm, which is larger than a focal tolerance of 0.9 μm that is to be set when a mask pattern is designed to be 0.30 μm×0.30 μm.

Although KrF excimer laser was employed as an exposure light in this example, it is of course possible to employ other kinds of light source having a different wavelength.
(Example 8)

FIGS. 11A to 11D show respectively a cross-sectional view illustrating in step-wise a method of forming a resist pattern according to an eighth example of this invention.

As shown in FIG. 11A, a resist (MX-P8) was coated under the same conditions as in the case of Example 1 on a silicon wafer 101 and baked at a temperature of 100° C. for 90 seconds to form a resist film 102. The film thickness of the resist film 102 after baking was found to be 500 nm.

Then, the resist film 102 was subjected to a patterning exposure through an ordinary reticle 103 which was provided with a contact hole having a diameter of 0.3 μm by making use of an ArF excimer laser stepper at a dosage of 200 mJ/cm² thereby to allow the exposure portion A to undergo a photo-crosslinking reaction.

Then, the silylation of resist film after exposure was performed in a silylation apparatus (MicroStar 200C, Genesis Co., Ltd.). Specifically, the vacuum chamber for silylation reaction in which a silicon wafer was housed was evacuated to 5 Torr and heated up to 100° C. Then, a vapor obtained by heating diethylaminodimethyl silane up to 50° C. was introduced as a silylating agent into the vacuum chamber thereby allowing a silylation reaction to take place therein. At this moment, the temperature of wafer was 100° C., the partial pressure of silylating agent in the chamber was 80 Torr, and the silylating reaction was performed by exposing the resist film 102 on the silicon wafer 101 to the vapor of the silylating agent for 90 seconds.

As a result, as shown in FIG. 11B, the un-exposure portion of the resist film 102 was fluidized immediately after the silylation reaction, thus flowing to the outer periphery of the contact hole-forming portion of the resist film 102, thereby forming silylated layers 105a and 105b covering the outer periphery of the contact hole-forming portion as shown in FIG. 11C.

Then, a dry development using an $O_2$ gas plasma was performed in a dry etching apparatus (TCP9400, Lam Research Co., Ltd.), whereby forming a pattern. Specifically, first of all, the etching was performed for 15 seconds under the etching conditions; 150 W in TCP power, 20 sccm in $CF_4$ gas flow rate, 5 mTorr in pressure and 100 W in RF bias, thereby etching away the silylated layer 10 nm in thickness on the surface of the resist.

Then, an etching was performed for 60 seconds under the etching conditions; 300 W in TCP power, 20 sccm in $O_2$ gas flow rate, 50 sccm in He gas flow rate, 5 mTorr in pressure and 100 W in RF bias, thereby forming a contact hole having a diameter of 0.2 μm as shown in FIG. 11D. As a result, a contact hole having a smaller size than a predetermined dimension could be formed.

FIG. 12 illustrates a relationship between the dosage of exposure light and the glass transition temperature. It will be seen from FIG. 12 that when the glass transition temperature is increased due to an increase in dosage of light and reaches to a predetermined glass transition temperature, the glass transition temperature is saturated. Therefore, it is possible to control the glass transition temperature by controlling the dosage of exposure light.

As explained above, it is possible according to this invention to easily prevent an auxiliary pattern (which is provided on a photomask for controlling the intensity of exposure light) from being resolved in a resist film. Further, in the case where an auxiliary pattern that is desired to be transferred is coexisted with an auxiliary pattern that is not desired to be resolved, the auxiliary pattern that is desired to be resolved can be selectively resolved on a resist film according to this invention by rendering a selected light-shielding portion of the mask to become translucent so as to control the silylation reaction, or by employing a silylating agent which is capable of increasing the glass transition temperature of the resist.

Furthermore, it is possible, when the auxiliary pattern is to be covered in the silylating process after light exposure, to employ a mask wherein the width of an auxiliary pattern therein is optimized so as to obtain a sufficient focal depth without being limited by the dimension of the auxiliary pattern.

Additionally, where a half-tone type phase-shifting mask is to be employed, it has become possible, in the formation of a contact hole pattern, to enhance the focal tolerance without permitting a secondary peak to be resolved in a resist film.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method of manufacturing a semiconductor device, which comprises the steps of;
   providing a photosensitive resin film having a first resin portion having a first glass transition temperature and a second resin portion having a second glass transition temperature which is higher than said first glass transition temperature;
   exposing said photosensitive resin film to an intermediate temperature between said first glass transition temperature and said second glass transition temperature, thereby fluidizing a surface portion of said first resin portion so as to cover a part of said second resin portion neighboring said first resin portion with the fluidized resin; and
   developing said photosensitive resin film by making use of said first resin portion and said fluidized resin covering said part of second resin portion as a mask.

2. The method according to claim 1, wherein a width of said first resin portion is at least twice as large as that of said second resin portion.

3. The method according to claim 1, wherein a thickness of said first resin portion is larger than that of said second resin portion.

4. A method of manufacturing a semiconductor device, which comprises the steps of:
   selectively silylating a photosensitive resin film by exposing said photosensitive resin film according to an exposure pattern thereby to form a silylated portion having a glass transition temperature which is lower than that of said photosensitive resin film and exposing said photosensitive resin film to an intermediate temperature between the glass transition temperature of said silylated portion and the glass transition temperature of said photosensitive resin film thereby fluidizing said silylated portion so as to cover a portion of said photosensitive resin film neighboring said silylated portion with the fluidized silylated portion; and
   developing said photosensitive resin film by making use of said silylated portion and by said fluidized silylated portion covering said portion of said photosensitive resin film as a mask.

5. The method according to claim 4, wherein the development of photosensitive resin film is performed by means of a dry development employing a plasma containing oxygen.

6. The method according to claim 4, wherein an unexposed portion of said photosensitive resin film is silylated.

7. The method according to claim 4, wherein an exposed portion of said photosensitive resin film is silylated.

8. The method according to claim 7, wherein the silylation reaction is performed by making use of a silylating agent having a single functional group.

9. The method according to claim 7, wherein the silylation reaction is performed by making use of a silylating agent having a plurality of functional groups in the same molecule.

10. The method according to claim 4, wherein said photosensitive resin film is exposed to a temperature which is higher than the glass transition temperature of the silylated portion after silylation of said photosensitive resin film.

11. The method according to claim 4, wherein the silylation reaction is performed at an intermediate temperature between the glass transition temperature of said silylated portion and the glass transition temperature of said photosensitive resin film.

12. The method according to claim 4, wherein said photosensitive resin film is exposed to light using a reticle provided on the edge portions of pattern with an auxiliary pattern.

13. The method according to claim 4, wherein an auxiliary pattern is formed to correspond with a portion of the photosensitive resin film neighboring said silylated portion.

14. The method according to claim 4, wherein said photosensitive resin film is exposed to light using a half-tone type phase-shifting mask.

15. The method according to claim 4, wherein said photosensitive resin film is exposed to light using a mask provided with a hole having a diameter which is smaller than a desired dimension in the formation of a contact hole pattern in said photosensitive resin film.

16. A method of manufacturing a semiconductor device, which comprises the steps of:
   selectively silylating a photosensitive resin film by exposing said photosensitive resin film through a reticle provided on its edge portions with a plurality of auxiliary patterns thereby to form a silylated portion having a glass transition temperature which is lower than that of said photosensitive resin film and at the same time rendering an outside portion of said plurality of auxiliary patterns to be translucent thereby performing a weak exposure on a portion of said photosensitive resin film corresponding to the translucent outside portion to perform an insufficient silylation, whereby obtaining an insufficiently silylated portion; and exposing said photosensitive resin film to an intermediate temperature between the glass transition temperature of said silylated portion and the glass transition temperature of said photosensitive resin film thereby fluidizing said silylated portion so as to cover a portion of said photosensitive resin film neighboring said silylated portion with the fluidized silylated portion, while preventing said insufficiently silylated portion from being fluidized; and
   developing said photosensitive resin film by making use of said silylated portion and said portion of said photosensitive resin film covered by said fluidized silylated portion as a mask.

* * * * *